US006946916B2

(12) United States Patent
Hyden et al.

(10) Patent No.: US 6,946,916 B2
(45) Date of Patent: Sep. 20, 2005

(54) ARRANGEMENT AND A METHOD RELATING TO PHASE LOCKING

(75) Inventors: Lennart Hyden, Göteborg (SE); Björn Lofter, Mölindal (SE); Måns Cederlof, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/947,409

(22) Filed: Sep. 23, 2004

(65) Prior Publication Data

US 2005/0104668 A1    May 19, 2005

Related U.S. Application Data

(63) Continuation of application No. PCT/SE03/00502, filed on Mar. 27, 2003.

(30) Foreign Application Priority Data

Apr. 2, 2002  (SE) .................................. 0200975

(51) Int. Cl.[7] .............................................. H03L 7/12
(52) U.S. Cl. ........................................... 331/4; 331/19
(58) Field of Search ................................ 331/4, 19, 23, 331/25; 327/159, 147, 150, 156

(56) References Cited

U.S. PATENT DOCUMENTS

| 3,852,682 A | * | 12/1974 | Dawe et al. .................... 331/4 |
| 4,001,714 A | * | 1/1977 | Reed ............................... 331/4 |
| 4,077,016 A | | 2/1978 | Sanders et al. ................. 331/4 |
| 5,552,727 A | | 9/1996 | Nakao ........................... 327/159 |
| 6,157,804 A | | 12/2000 | Richmond et al. .......... 399/319 |

OTHER PUBLICATIONS

Patent Abstracts of Japan, JP 6-097821, Apr. 8, 1994.

* cited by examiner

Primary Examiner—Joseph Chang
(74) Attorney, Agent, or Firm—Nixon & Vanderhye, P.C.

(57) ABSTRACT

The present invention relates to an arrangement for phase locking of a Voltage Controlled Oscillator (VCO) to a selected frequency harmonic among a number of predetermined or available frequencies (harmonics), comprising a reference generator for generating a reference frequency, a phase lock loop (1; 10$_1$; 10; 4, 5, 6, 9) for producing an output signal in response to the input reference frequency, said phase lock loop comprising (enclosing) a phase defector (1), a loop filter (10), said VCO (5), adding means (4) and a power splitter (6). The arrangement also includes a sweep generator (9). It further comprises or is associated with storing means 82) for scoring information about, for each selectable or available frequency harmonic, a first (coarse) control voltage providing a VCO frequency output which is lower/higher than, and differs from the selected frequency (harmonic) by a given value ($\Delta f_1$). That the sweep generator (9) adds (superimposes) a controllable sweep voltage to/on the first control voltage at least until a varying, second frequency difference ($\Delta f_c$) between the output VCO frequency and the selected frequency harmonic reaches a given value. Monitoring/detecting means are provided for detecting the varying, second frequency difference ($\Delta f_c$) between the selected frequency harmonic and the VCO output frequency, and sweep generator control means are provided for reducing the sweep rate until the VCO is phase locked to the selected frequency harmonic.

23 Claims, 7 Drawing Sheets

ARRANGEMENT AND A METHOD RELATING TO PHASE LOCKING

This application is a continuation of application No. PCT/SE2003/000502, filed Mar. 27, 2003, the entire contents which is hereby incorporated by reference in this application.

FIELD OF THE INVENTION

The present invention relates to an arrangement for phase locking of a Voltage. Controlled Oscillator (VCO) to a selected frequency harmonic of a number of predetermined, i.e. available, frequency harmonics of a reference frequency, comprising a reference generator for generating said reference frequency, a phase lock loop for producing an output signal in response to the input reference frequency, which phase lock loop comprises, a phase detector, said VCO, a filter and a sweep generator. The invention also relates to a method for locking the phase of a Voltage Controlled Oscillator to a selected frequency harmonic of a number of available or predetermined frequency harmonics of an input reference frequency. The invention also relates to an arrangement and a method through which a frequency shift can be provided for.

STATE OF THE ART

Pre-manufactured digital PLL (Phase Lock Loop) circuits are available which comprise a frequency as well as a phase lock functionality. Such circuits are advantageous in so far as they are simple to use. However, a disadvantage of such digital circuits is that the noise level is high, particularly a considerable noise of the phase of the phase locked VCO signal will result.

In addition thereto analogue phase detectors are known, particularly of the type "sample and hold" or mixers. The phase noise is much lower for such phase detectors, i.e. much lower than for digital arrangements. It is however a drawback of such circuits that they do not contain any frequency lock functionality. In order to provide for a frequency lock, the VCO has to be controlled or directed to the same frequency as the desired harmonic, multiple of the reference frequency. The deviation may not exceed the maximum of the bandwidth of the phase lock loop. Today known methods for driving the VCO to the appropriate frequency at phase locking are complicated and the time it takes to acquire phase lock is comparatively long.

From another known arrangement it is also known to lock the VCO using a PLL circuit. The control voltage input to the VCO is sampled, converted in an A/D converter and stored into a storing means. The PTA circuit is then disconnected, and instead an SPLL (Sampling PLL) circuit is connected. The stored value for the voltage is converted in a D/A converter and it is used to drive the VCO to the appropriate frequency. Even if the noise will be lower using such a method, it still takes a long time to perform a frequency shift.

US-A-5 703 538 discloses a radar exciter with a phase lock loop responsive to an input reference signal for producing an exciter output signal, with a rapid phase lock acquisition circuit having an output connected to the VCO during the phase acquisition mode for driving the VCO to a commanded frequency, and achieving phase lock. A ramp generator circuit is used for, in response to digital output control signals from a controller, generating ramp signals at the output connected to the VCO during the phase acquisition mode. Input signals (to controllers) include a zero beat signal for counting harmonics and indicating out-of-lock conditions, and the digital output control signals include digital ramp slope control signals, digital ramp start/stop signals and digital ramp direction signals. However, this device is complicated and requires complicated control means. For example it requires counting of harmonics and it is not fast enough, phase lock can be achieved in, advantageously, less than 40 microseconds, which is a comparatively long time for various implementations and usages.

SUMMARY OF THE INVENTION

What is needed is therefore an arrangement for phase locking which is faster than hitherto known arrangements, i.e. which acquire, a phase lock condition faster than known arrangements. A phase locking arrangement is also needed which is easy to use, easy to manufacture and which has a simple structure.

Particularly a phase lock arrangement is needed through which the phase noise of a phase locked VCO signal will be low. An arrangement is also needed which allows for a fast frequency shift. Still further an arrangement is needed through which the risk of locking to the wrong frequency (harmonic), i.e. to another frequency than the selected one, is reduced. Still further an arrangement is needed which gives a secure phase lock to a selected frequency harmonic also with respect to the temperature dependence of the frequency, which depends on the voltage.

Therefore an arrangement as initially referred is provided which further comprises, or is associated with, storing means for storing information about, for each selectable frequency harmonic, a first (coarse) control voltage providing a VCO frequency output signal which is lower than, (or alternatively higher than), and differs from, the selected frequency harmonic by a given first frequency difference value ($\Delta f_1$). The sweep generator adds or superimposes a controllable sweep voltage on the first control voltage, and monitoring/detecting means are provided for detecting the difference between the selected frequency harmonic and the VCO output frequency. The sweep generator control means will control the sweep rate in dependence of the variable, also denoted second, frequency difference for reducing the sweep rate (as the second difference diminishes) until the VCO is phase locked to the selected frequency harmonic, i.e. when a phase lock condition has been achieved. In other words the sweep rate is given by the "distance" to the selected frequency harmonic. In a particular implementation the monitoring/detecting means provides for a continuous detection of the difference between the selected frequency harmonic and the VCO output frequency, i.e. of the variable, second, frequency difference ($\Delta f_c$). In an alternative implementation the monitoring/detecting means provides for a stepwise or discrete detection of the variable, second, frequency difference ($\Delta f_c$).

In a particularly advantageous implementation the sweep generator control means continuously reduces the sweep rate. In an alternative implementation the sweep generator control means stepwise reduces the sweep rate. It is also possible to provide a first, fixed sweep rate until the variable second frequency difference ($\Delta f_c$) assumes a given value and subsequently continuously or stepwise reduce the sweep rate until phase lock is achieved. It is also possible to reduce the sweep rate in a variable manner, e.g. to a lesser and lesser extent the smaller $\Delta f_c$ gets.

Particularly an indication signal is provided at reaching said value for the variable second frequency difference ($\Delta f_c$).

In a particularly advantageous implementation the phase locking loop is a sampled phase lock loop (SPLL), i.e. the phase detector is a sampling phase detector. In another implementation the phase detector is not sampling. In principle the concept applies to any kind of phase detector.

Advantageously the sweep generator is disconnected or switched off when the VCO is phase locked. The arrangement particularly comprises an integrating loop filter. One reason to use an integrating filter is to be able to discharge the sweep voltage between different frequency shifts. However, it is not necessary to use an integrating loop filter.

Advantageously a comparator is used to detect the/a signal from the phase detector. Particularly supplementary control means are provided to assure a continuous sweep from the sweep generator also when the comparator is not able to detect a signal from the phase detector. Such may with advantage be used particularly when the phase detector is narrow-banded, i.e. has a narrow bandwidth. Then, however, it has to be possible to switch off the integrating functionality of the loop filter, if a loop filter with an integrating functionality is used.

When a DC voltage is output or detected from the phase detector, phase lock has been achieved. Alternatively the time periods that lapse between subsequent pulses from the comparator are measured, and when and time intervals are long enough ($\Delta f_c$ small enough), it is considered that phase lock has been achieved.

Here supplementary control means are not necessary if the phase detector has a sufficient bandwidth. However the supplementary control means, when provided, or needed, provides control signals to the loop filter disposed between the phase detector (and optionally to adding means for providing the signal input to the VCO), optionally to the sweep generator, and to the storing means.

However, irrespectively of whether any supplementary control means are provided or not and how they are implemented, the signal from the phase detector is via a comparator and a mono-stable gate input to the sweep generator. In a preferred implementation a first signal pulse from the mono-stable gate is detected via a first signal indicating that a first fixed sweep rate is to be replaced by the second sweep, the rate of which is continuously or stepwise reduced as the detected second varying frequency difference ($\Delta f_c$) is reduced. Particularly this reduction occurs faster or continuously at a predetermined value of the second variable frequency difference, or slower and slower the smaller $\Delta f_c$ gets.

According to the invention a D/A-converter is disposed between the storing means and the adding means providing the input signal to the VCO. (The voltage contributions from the loop filter and from the sweep generator to the adding means should at the beginning of the phase locking procedure or frequency shifting, be zero. Alternatively they may assume known, fixed values.)

A method for locking the phase of a voltage controlled oscillator to a selected frequency harmonic among a number of predetermined (available) frequency harmonics is therefore also suggested, which comprises the steps of; finding, in storing means, a first control voltage associated with the selected frequency harmonic which has a value such that the frequency of the VCO output will be lower. than, (or higher than), and differ, by a given first value ($\Delta f_1$), from the selected frequency harmonic; applying the found, first control voltage; adding (superimposing) a sweep voltage (with a fixed rate) to the first control voltage; detecting/monitoring the (varying) frequency difference ($\Delta f_c$) between the VCO output frequency and the selected frequency harmonic; at least from a given detected frequency difference controlling the rate of the sweep voltage in dependence of the frequency difference by reducing it until the VCO is phase locked. The method in a most advantageous implementation comprises the step of monitoring the varying frequency difference ($\Delta f_c$) continuously. Alternatively the method comprises the step of detecting (establishing) the varying frequency difference ($\Delta f_c$) at discrete time intervals.

The method may further include, most advantageously, the step of further reducing the rate of the sweep continuously. More particularly the method comprises the steps of; providing a reference signal (having the selected frequency) to a phase detector, finding the first control voltage relevant to the selected harmonic of the reference frequency in storing means; converting in a D/A-converter the output from the storing means; applying the first control voltage to the VCO; detecting the second, varying, frequency difference in a sampling phase detector; using said second frequency difference to provide a control signal to the sweep generator to vary/reduce the sweep rate; when the output signal from the sampling phase detector comprises a DC-voltage, indicating phase lock to the selected frequency, or when the time interval between subsequent pulses from the comparator (detecting the signals from the phase detector), is sufficiently long, ($\Delta f_c$ small enough) establishing that phase lock has been achieved; switching off the sweep.

In one implementation, relevant to the case when the phase detector does not have a sufficient bandwidth, providing a supplementary control signal to the sweep generator, to the loop filter and to the storing means to assure that the selected frequency harmonic is found despite there being no output signal (possible to detect by the comparator) from the phase detector. Particularly the method includes the step of using an integrating switch-off able loop filter, which integrating loop filter, i.e. the integrating functionality thereof, is switched off when a phase lock procedure (frequency shift) is initiated, the integrating functionality being switched on when phase lock is achieved.

It is an advantage of the invention that phase lock to a selected frequency or to a selected frequency harmonic can be achieved particularly in a few microseconds time, most particularly within approximately two µs.

BRIEF DESCRIPTION OF THE DRAWINGS

The invention will in the following be more thoroughly described, in a non-limiting manner, and with reference to the accompanying drawings, in which.

DETAILED DESCRIPTION OF THE INVENTION

According to the invention a reference frequency $f_{ref}$ is input to a phase detector 1 to lock VCO 5 in a phase loop to a selected harmonic of the reference frequency. In general terms, the VCO 5 is first driven, coarsely, using a first (coarse) control voltage $V_{control}$, to a frequency which is somewhat lower (here; it could alternatively have been higher, then instead sweeping downwards) than the selected or desired frequency, particularly frequency harmonic of a reference frequency. A voltage sweep is then added by sweep generator 8 to the first control voltage. This will drive the VCO frequency towards the selected frequency harmonic. The frequency difference between the selected or desired frequency harmonic and the VCO frequency output is detected as $\Delta f_c$ i.e. the error frequency, by the comparator 7 used to provide distinct "switches", and a retriggerable mono-stable gate 8 is used to provide sufficiently long and reproducible pulses. The $\Delta f_c$ value is used to control the sweep rate such that it will decrease as the VCO frequency approaches the selected frequency harmonic. When the VCO frequency is sufficiently close to the selected frequency, such that the phase loop has locked the VCO, the sweep is completely switched off.

Figure 1:
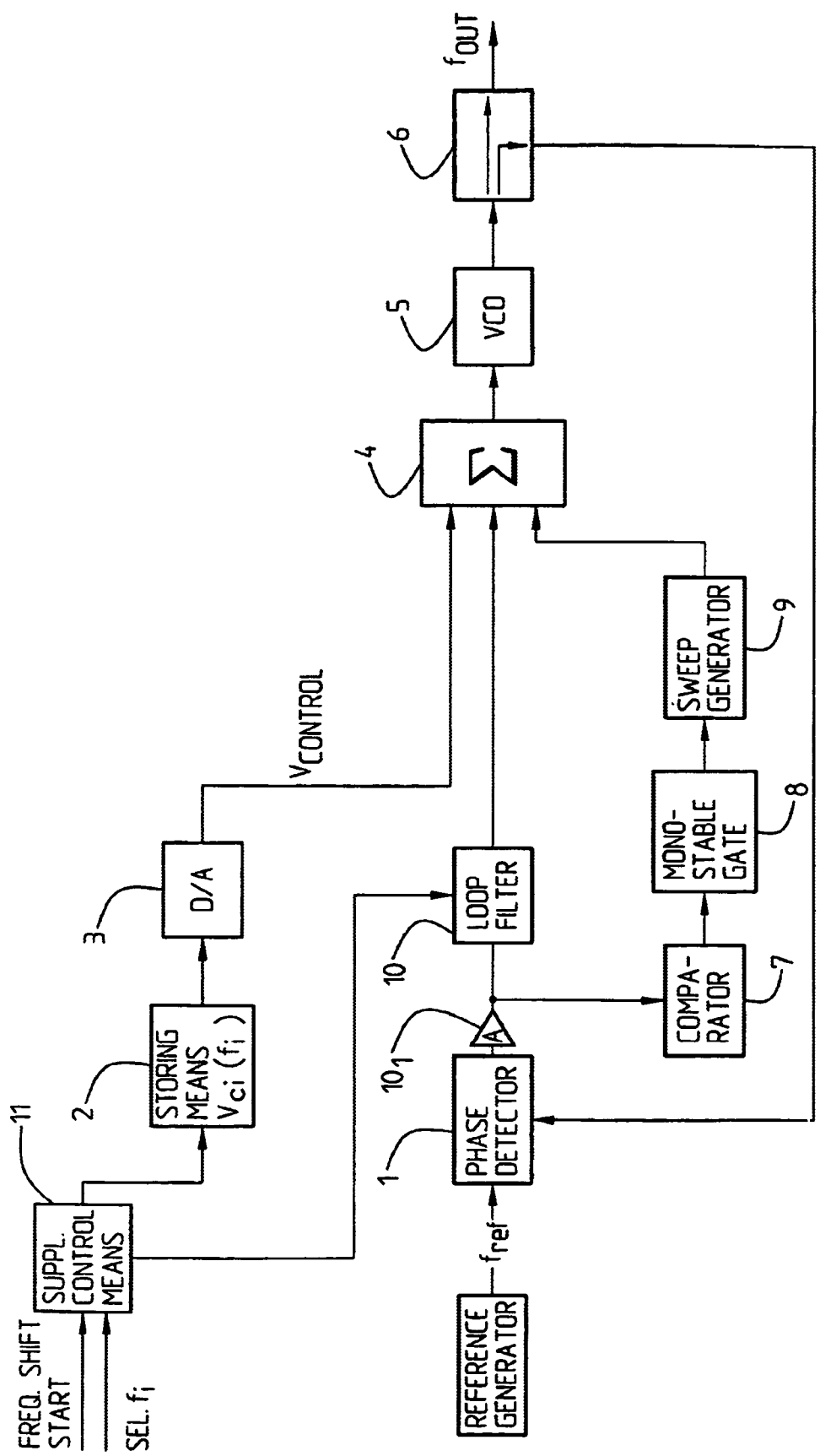
FIG. 1 is a block diagram particularly illustrating a first embodiment of the invention.

A first implementation is schematically illustrated in the block diagram of FIG. 1. It is supposed that a particular frequency harmonic $f_i$ is selected which is a harmonic of the reference frequency $f_{ref}$ which is input to a phase detector 1 from a reference generator. Supplementary control means 11 are used to control the loop filter 10, to switch on and off the integrating functionality thereof, and the signal frequency shift start triggers the initiation of a frequency shifting procedure, or a phase lock procedure. Information about the selected frequency harmonic $f_i$ is used to find the relevant control voltage $V_{control}$ in storing means 2 which will drive the VCO to a frequency that differs from the selected frequency harmonic $f_i$ by a given value $\Delta f$. It is supposed that values for first control voltages relevant for each available frequency harmonic are stored in storing means 2. This is supposed to have been done at an earlier stage and the storing means 2 contains the first control voltages for all the frequencies to which the VCO 5 should be able to lock. Since the VCO 5 has an output power which is different for different frequencies, the loop gain will depend on the VCO frequency. In order to obtain a total loop bandwidth which is the same for all harmonics of the reference frequency to which the VCO should be possible to lock, it is required that an amplification control is used. From the storing means 2, which contains the first coarse control voltages for each frequency harmonic, a digital to analog conversion is performed in D/A-converter 3.

In an advantageous implementation a sampling phase detector 1 is used. This gives a lower phase noise than if a phase detector which is not sampling would be used. For a sampling phase detector it is required that the first control voltage is well defined and that a voltage sweep is used to drive the VCO within the loop bandwidth. Upon initiation of the phase lock procedure or frequency shifting, the voltage contributions from loop filter 10 and sweep generator 9 should be zero, or alternatively they should assume constant, known values.

As the first control voltage is applied, the sweep generator 9 starts a sweep with a constant sweep rate (V/s). When the sweep control detects a signal from the phase detector 1, i.e. that the VCO output frequency approaches the selected frequency harmonic $f_i$, the sweep rate is gradually reduced until the phase loop locks the VCO 5. When the VCO is locked, the sweep is completely switched off, and the frequency shift is completed. By reducing the sweep rate, the risk of missing (passing) the selected frequency harmonic during the sweep is reduced, and the risk of locking to the wrong frequency harmonic is also reduced.

As a sampled phase detector is used the provision of a first coarse control voltage is required. Moreover, in a particular implementation an integrating loop filter 10 is used, i.e. a loop filter with a integrating functionality. The supplementary control means 11 provide a signal to the filter to indicate when the integrating functionality is to be switched on/off. In FIG. 1 loop amplifier $10_1$ is illustrated as a separate element between the phase detector 1 and the loop filter 10. The amplifying functionality can however also be included in the filter 10, or vice versa. An example on such a filter is more thoroughly described in FIG. 6 below. One of the reasons for using an integrating loop filter is to enable discharging of the sweep voltage between subsequent frequency shifts or lockings to different frequency harmonics. During discharging, the integrating loop filter is used to compensate for the reduced contribution from the sweep to the assumed tuning voltage. According to the invention the first control voltage output from the D/A-converter 3 will control the VCO 5 such that it will be driven to oscillate $\Delta f_1$, for example 50 MHz, below/over the selected frequency harmonic. It should be clear that the value 50 MHz only is given as one specific example, the main thing being that $\Delta f_1$ is so much lower/higher than the selected frequency harmonic itself that the control voltage on which the sweep voltage is superimposed will not simply pass, and hence not lock the VCO to, the selected frequency harmonic. It should also be clear that $\Delta f_1$ depends on the frequencies used, on the amount that subsequent frequency harmonics differ from one another etc. $\Delta f_1$ has to be smaller than the frequency difference between subsequent .harmonics, preferably as close as possible to the selected frequency without running the risk of sweeping past the selected harmonic.

The inventive concept is applicable to in principle any frequency, also to very high frequencies, such as e.g. several GHz or more than that, then, however, how high the frequencies can be will be given by how small circuits it is possible to build, otherwise there is no limitation.

The sweep functionality comprises a transistor through which the current is driven. The current through that transistor is used to charge a capacitor. A constant current through the transistor will give a linear voltage increase across the capacitor.

In one implementation the frequency shift or the phase lock to a selected frequency harmonic will function as follows. First the loop filter 10 is to be switched from an integrating filter to a filter having a limited amplification at DC. Some time is required in order to allow for discharging of the capacitor of the loop filter, cf. C2 in FIG. 6 below. When the loop filter is discharged, the relevant (for the selected $f_i$) first control voltage (found in the storing means 2) which also is denoted a coarse voltage, will be applied. As referred to above it is selected in such a manner that the VCO frequency will be $\Delta f_1$ below/over the frequency harmonic to which the VCO should be locked. Since the VCO is temperature dependent, it may be necessary to calibrate the first control voltage to a value that takes the temperature dependence into account. A sweep is subsequently initiated by the sweep generator 9. The activation may be provided through closure of a sweep switch. The fixed sweep is superimposed or added to the first control voltage $V_{c1}$. When approaching the bandwidth of the sampling phase detector 1, a second, varying frequency difference is detected, which also may be denoted an error frequency $\Delta f_c$. This signal is detected after the input amplifier $10_1$. A comparator 7 is used to detect pulses from the phase detector and to provide distinct switching and a retriggerable, monostable gate 8 is used to provide pulses which are sufficiently long and reproducible. As the varying second frequency, the frequency $\Delta f_c$, decreases, also the sweep rate will be decreased. In that manner the risk of sweeping past the selected frequency harmonic is considerably reduced. Eventually the selected frequency harmonic will fall within the bandwidth of the loop, i.e. $\Delta f_c$ will be so small, that the VCO will be locked to the reference frequency. When the VCO finally is locked, the integrating functionality of the loop filter 10 is again switched on (the integrating functionality always has to be switched off during a voltage sweep), and the phase lock procedure is completed. The filter will now compensate for the sweep discharge, which is necessary in order for it to be prepared for the subsequent phase locking procedure and the subsequent frequency shift.

According to the invention it is supposed that the VCO characteristic is detected before initiation of any phase lock/frequency shift procedure in order to find the appropriate control voltages to be stored in the storing means 2. Through manually applying a control voltage or a coarse voltage to the VCO, it gets possible to establish the VCO characteristics at different temperatures. Data is then stored into the storing means 2 so that the first coarse control voltages will correspond to and differ from the frequencies (harmonics) by a given value differing to a certain extent from the respective frequency harmonics. During this measurement the loop should be closed to avoid any erroneous contributions to the adding means, for example due to offset voltages.

In a particular implementation a signal is used to indicate that/when the fixed sweep should be switched off. It is done after a detection from the monostable gate 8. Subsequently the time period between two pulses from the monostable gate is measured. When the time period is longer than a given, predetermined value, the sweep rate is reduced. When there is no pulse within the above mentioned time interval, it is supposed that the frequency difference is so small that the frequency is within the bandwidth of the loop, and the loop will lock the VCO. Then there is no need for any further sweeps but instead the integrating functionality of the loop filter is switched on, and the frequency shift is concluded.

The modulation sensitivity of the VCO is generally different for different frequency harmonics. The same voltage sweep will give different sweep rate in MHz/μs, which is a result of the variation in modulation sensitivity. This means, that different frequency harmonics will be more or less easy to "detect", i.e. the risk of sweeping past them, differs. However, in an advantageous implementation a phase detector sampler having a large bandwidth is used. It will provide an earlier detection to indicate switch off of the fixed sweep, which as such reduces the risk of missing a frequency harmonic during a sweep. It is also possible to reduce the sweep rate for all frequency harmonics. Then, however, the frequency shift procedure will be somewhat slower, but this might be compensated for by selecting the first control voltage to be closer to the selected frequency harmonic already from the beginning. Still further it would be possible to implement different sweep rates for the different frequency harmonics; such a solution would however be somewhat more complicated. It is also possible to select the sweep rate in respect of the comparator threshold value and adjust the amplification such that the risk to sweep past a frequency harmonic without providing for locking is reduced.

Figure 2:
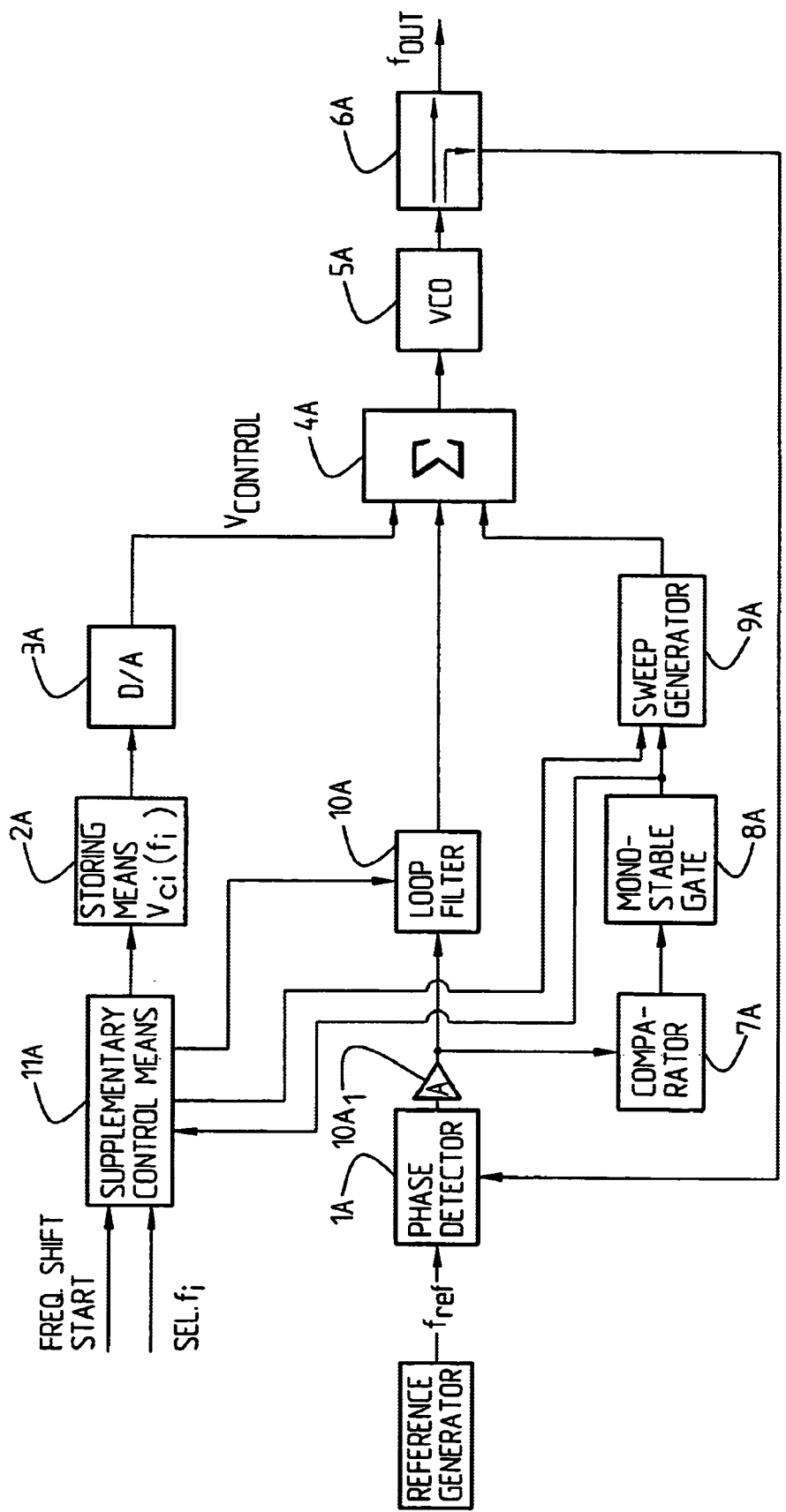
FIG. 2 is a block diagram illustrating a second embodiment of the invention including supplementary control means for a narrow-band phase detector.

In the embodiment of FIG. 1, supposing that the phase detector has a large bandwidth, it is not necessary to use a fixed sweep rate at the start of the frequency shift. In the embodiment of FIG. 2, however, it is supposed that the phase detector does not have a bandwidth which is sufficiently large. The situation might occur that there is no output signal from the phase detector to the loop filter detectable by the comparator even if there should be one. A control mechanism (supplementary control means) 11A is then needed in order to provide the sweep generator 9A with a signal also when there is no signal from the comparator 7A until a signal actually is detected at the monostable gate 8A. Subsequently, from that point, the sweep or the sweep rate is controlled by a signal that stepwise changes the sweep rate (or continuously). In order to provide for such an additional control functionality, supplementary control means 11A are provided, to which information about the selected frequency harmonic $f_i$ is provided. A signal is then provided to the loop filter 1CA (via amplifier $10A_1$), to the sweep generator 9A and, of course, to the storing means 2A. A feedback is also provided from after monostable gate 8A to the supplementary control means. The other components function in a manner similar to that described with reference to FIG. 1, and they bear the same reference numerals with the addition of a reference "A". Also in the embodiment of FIG. 2, it is a requirement that the integrating functionality of the loop filter 10A can be switched off, which is handled by the supplementary control means 11A (cf. FIG. 1).

Figure 3:
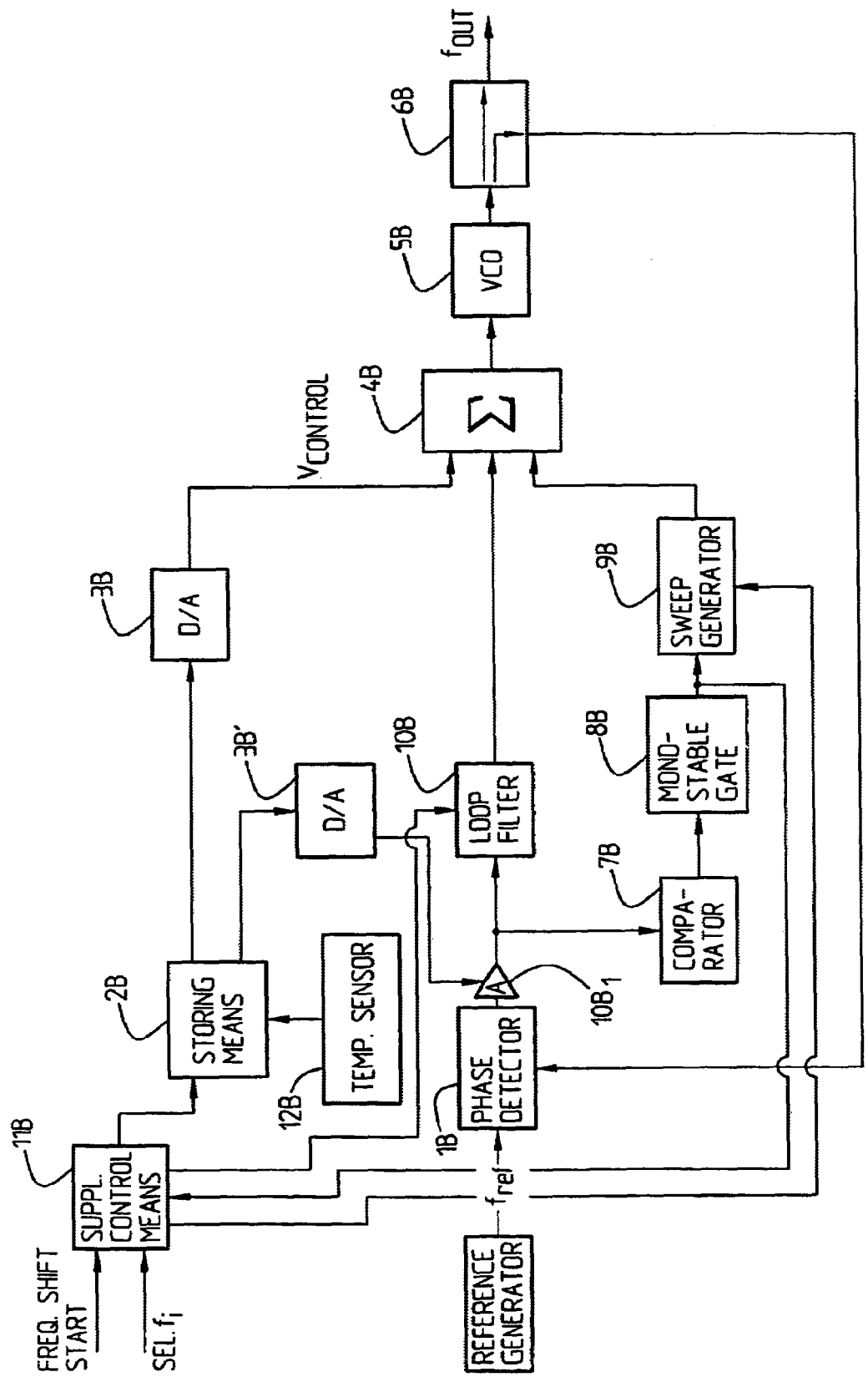
FIG. 3 is an embodiment differing slightly from the embodiment of FIG. 2.

FIG. 3 is an illustration of an embodiment which is very similar to that of FIG. 2. However, the supplementary control means 11B and the storing means 2B are connected to each a D/A-converter 3B, 3B' respectively. The D/A converter 3B' is used to control the loop gain. In this embodiment the supplementary control signalling is provided to the loop filter 10B, to the sweep generator 9B, as in FIG. 2. In the figure also temperature sensing means 12B as discussed earlier are provided which are used for finding and storing the values of the respective control voltages, and also for finding the appropriate first coarse voltage when performing a new frequency shift. An input signal is provided to the supplementary control means 21B indicating the selected frequency harmonic. The signal "frequency shift start" is used to initiate the frequency shift. In the remaining aspects the functioning is similar to that described above with reference to FIG. 2, the corresponding numerals being provided with a letter "B".

Figure 4:
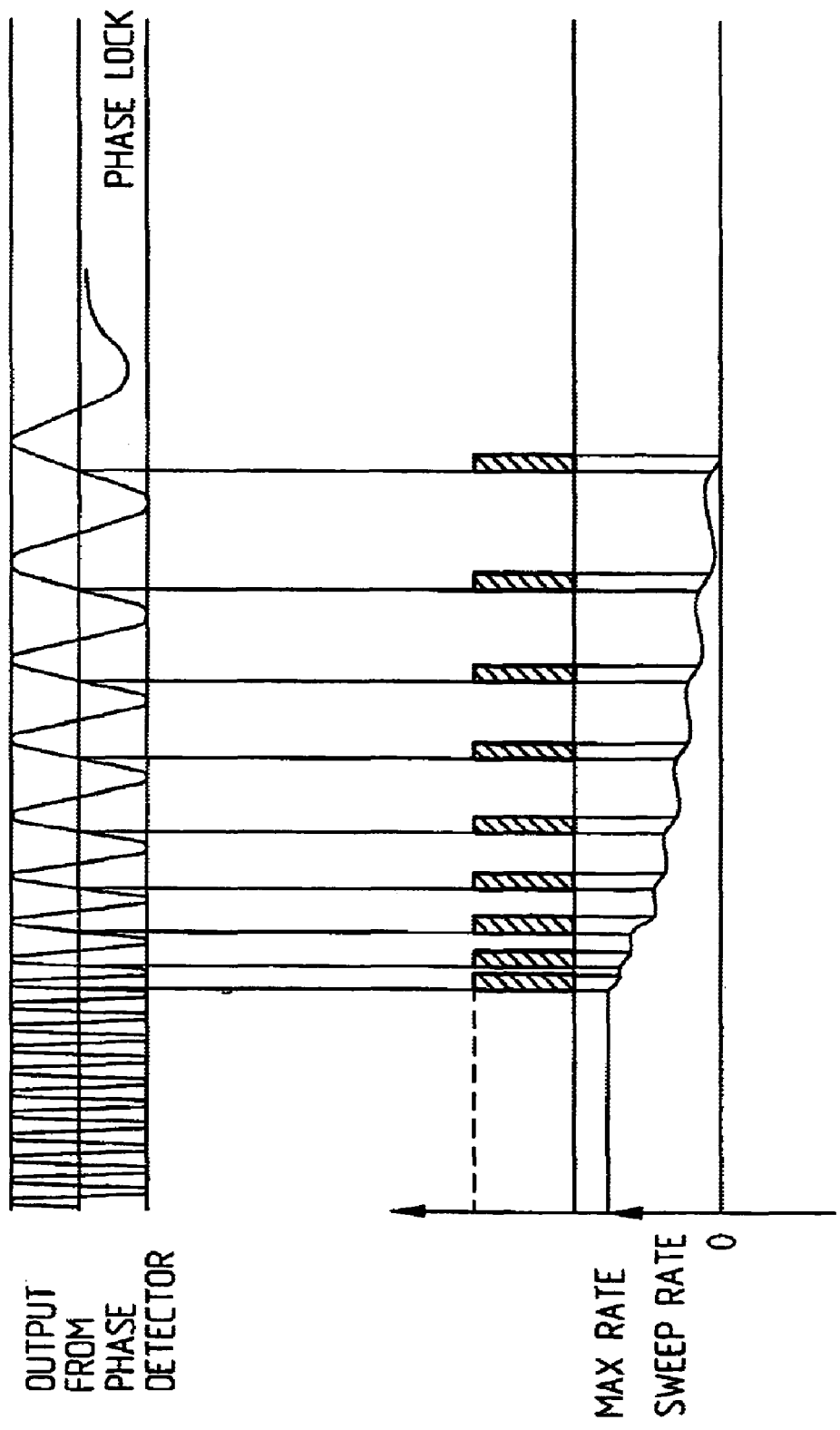
FIG. 4 is a diagram illustrating variation in output signal from the phase detector as a function of the sweep rate.

FIG. 4 is a diagram illustrating the output from the phase detector as a function of the sweep rate. For maximum sweep rate the monostable gate will trigger all the time (there is a logical one all the time). However at a given point (when $\Delta f_c$ falls below a given value) an indication signal is provided indicating to the sweep generator that it should reduce the sweep rate. As the frequency is reduced, even if the sweep gets slower and slower, the output approaches a DC voltage, i.e. when the second varying frequency difference approaches zero, a phase lock condition will finally be acquired.

Figure 5:
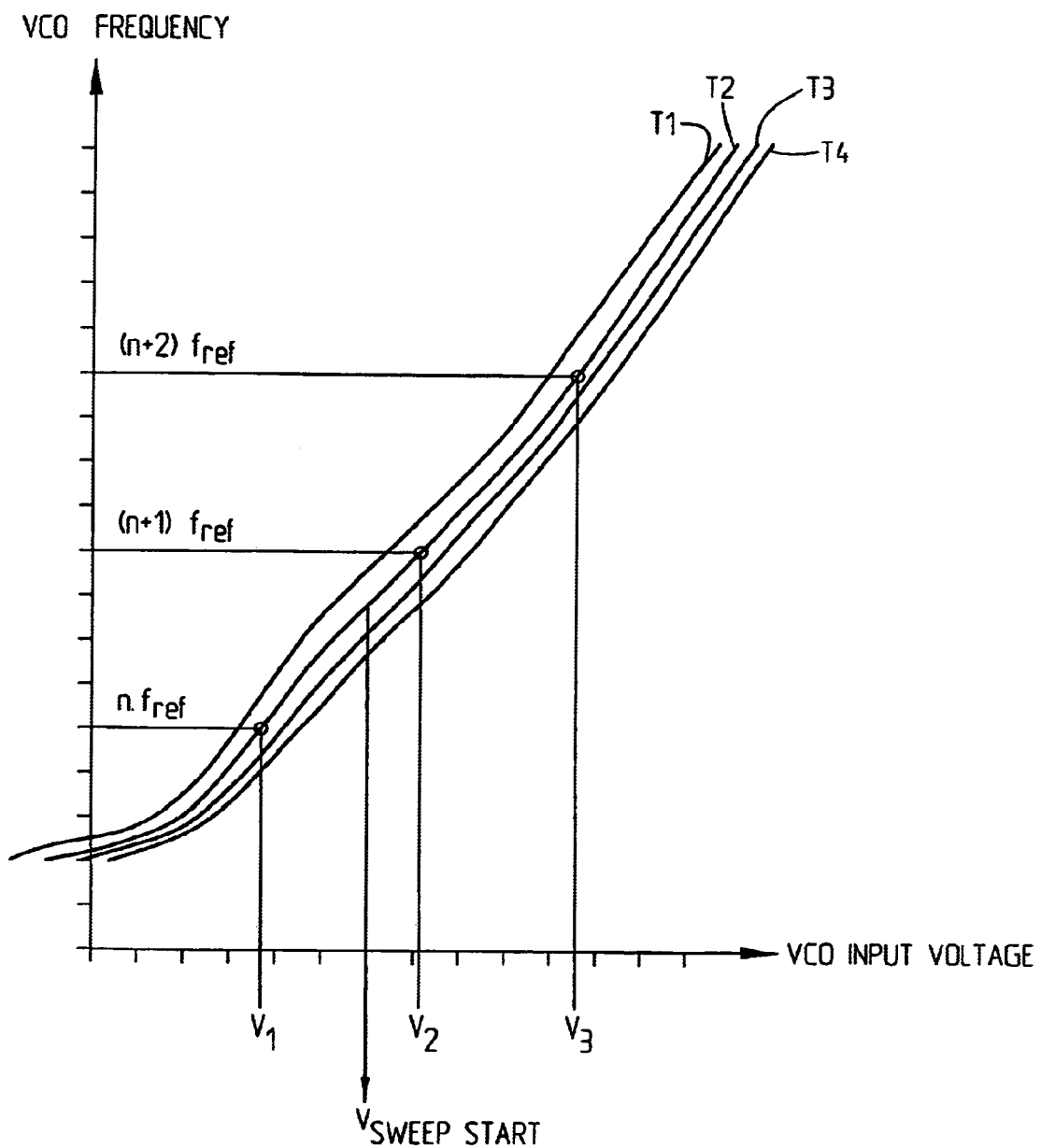
FIG. 5 is a diagram illustrating the VCO frequency as a function of the VCO voltage, FIG. 6 schematically illustrates an example on an integrating loop filter that can be used, FIG. 7 schematically illustrates the adding means according to one implementation of the invention.

FIG. 5 is a schematical diagram illustrating VCO frequency as a function of the VCO voltage. In the figure three different frequency harmonics, $n \times f_{ref}$, $(n+1) \times f_{ref}$ and $(n+2) \times f_{ref}$ are indicated. Here it is supposed that the reference frequency is $f_{ref}$ and available frequency harmonics, i.e. the frequency harmonics to which the VCO can lock, are multiples n, n+1, and n+2 of $f_{ref}$. The different lines indicate the frequency as a function of the voltage respectively for different temperatures, here $T_1°$, $T_1°$, $T_3°$, $T_4°$.; It is indicated when the sweep voltage is initiated to ensure phase lock to frequency harmonic n+1 ($\times f_{ref}$). It is then swept up to $V_2$ for a temperature $T_2°$ C. ($V_1$ and $V_2$ are corresponding voltages for multiples (harmonics) n and n+1). The relevant first control voltages of the respective harmonics are stored in the storing means.

Figure 6:
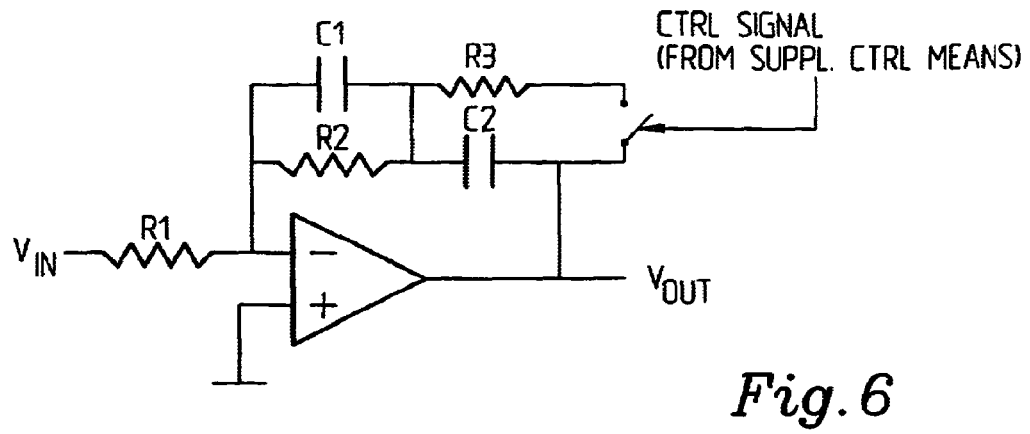

In FIG. 6 one example on an integrating loop filter that can be used in the loop is illustrated. However, in order to provide for a disconnectable integrating functionality, a resistor can be connected in parallel with the capacitor C2 in order to limit amplification at low frequencies. The resistor is disconnected when the phase lock has been achieved. A control signal is provided from the supplementary control means to switch on/off the integrating functionality of the loop filter, i.e. a switch can be closed. Particularly an amplifier nay be provided at the output of the sampler of the phase detector to control the loop gain and the bandwidth of the signal from the phase detector. The filter output is connected to one of the inputs of the adding means.

Figure 7:
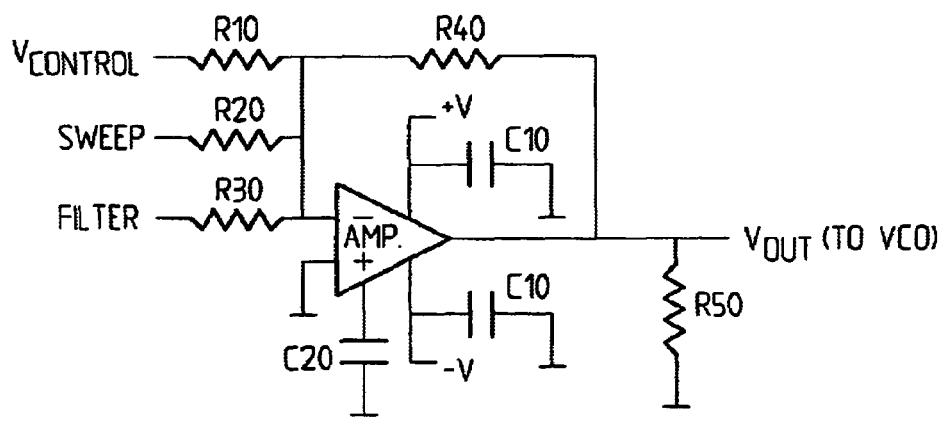

FIG. 7 very schematically illustrates one example of an adding means to which is input the first coarse control voltage, the sweep voltage and the signal output from the filter. The output from the adding means is provided to the VCO. It should however be clear that this figure merely is illustrated as an example of a circuit solution, with resistors R10, R20, R30, R40, R50, capacitors C10, C10 and C20.

Figure 8:
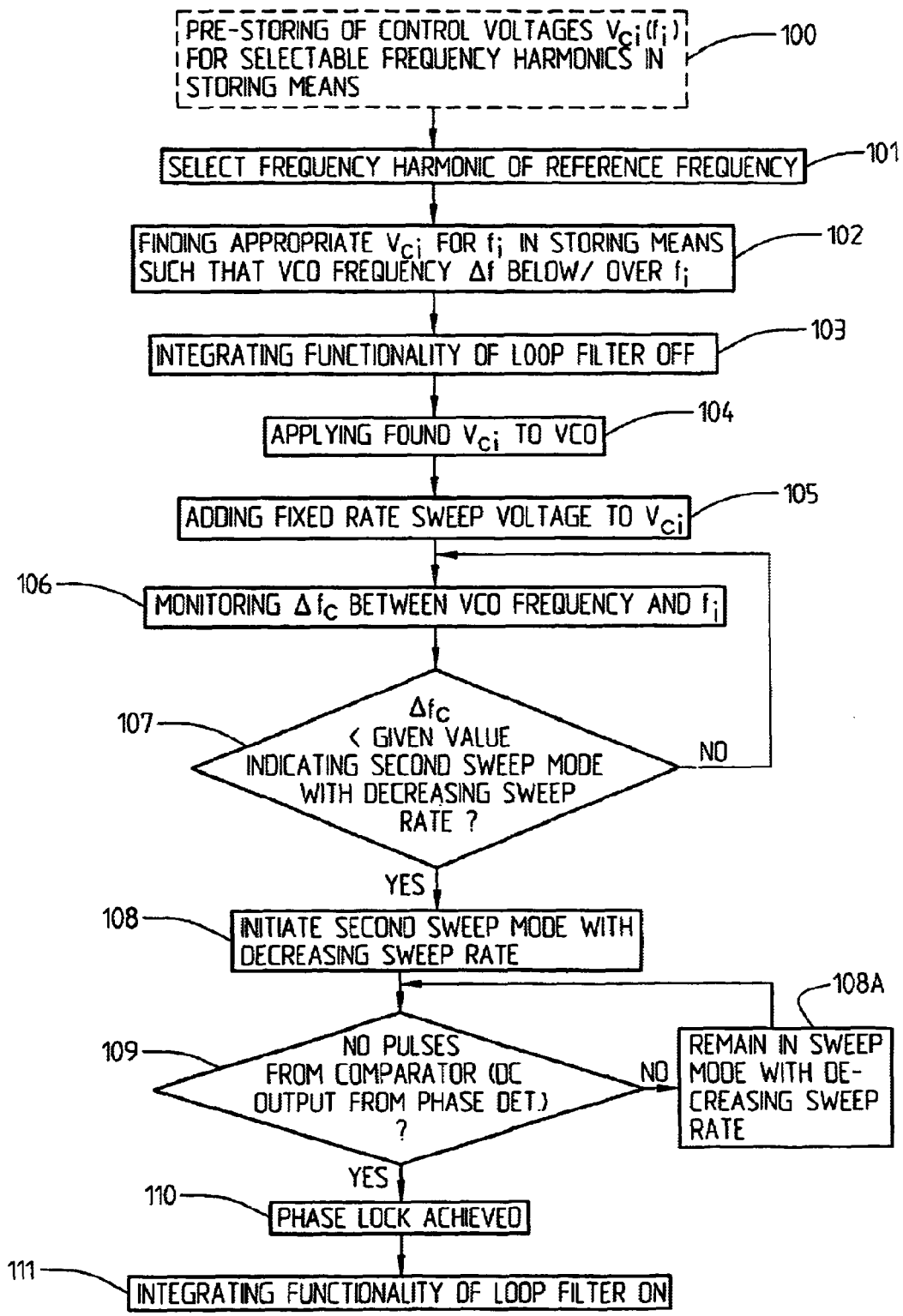
FIG. 8 is a schematical flow diagram illustrating the phase lock procedure according to one implementation of the present invention.

FIG. 8 is a very schematical flow diagram illustrating the procedure for phase locking the VCO to a selected frequency harmonic $f_i$, or for providing a frequency shift. It is supposed that pre-storing of appropriate first coarse control voltages $V_{ci}$ ($f_i$) has been done in storing means for all the selectable or available frequency harmonics, 100. This step is indicated within dashed lines since it is done separately and the stored values can be used for every phase lock procedure for the respective available frequency components. Then it is supposed that the relevant frequency harmonic of the reference frequency is selected (input to the supplementary control means), 101. The appropriate $V_{ci}$ for $f_i$ is then found in the storing means such that the VCO frequency will be $\Delta f$ below/over $f_i$, 102. The integrating functionality of the loop filter is then switched off, 103. The found control voltage $V_{ci}$ is thereupon applied to the VCO via the adding means, 104. A voltage sweep with a fixed sweep rate is added to the control voltage, 105. The frequency difference $\Delta f_c$ between the detected VCO frequency and $f_i$ is then monitored, 106 if the $\Delta f_c$ is not below a given value, it is proceeded with monitoring of $\Delta f_c$ and the sweep is continued with the fixed sweep rate. If $\Delta f_c$ is below the given value a sweep mode with a lower sweep rate should be used, 107, 108, finally it will be established if a DC-voltage is output from a phase detector, (no pulses from comparator) 109. If not, the sweep rate is further decreased, 108A, until finally a DC voltage is output from, the phase detector, indicating that phase lock has been achieved, 110, to the selected frequency harmonic. More specifically, according to an alternative to step 109, the time interval that lapses between subsequent pulses from the comparator is detected, and when that time interval is detected to be sufficiently long (i.e. $\Delta f_c$ small enough), it is considered that phase lock has been achieved. Step 107 is optional, preferably only $\Delta f_c$ is detected/monitored, and the sweep rate reduced in dependence thereof, e.g. continuously or even mere particularly to a smaller and smaller extent as $\Delta f_c$ gets smaller. When phase lock has been achieved (110), the integrating functionality of the loop filter is switched on, 111.

In alternative implementations, instead of starting with a frequency that is lower than the selected frequency (and differs therefrom by a given value) it is also possible to start with a frequency that is higher than the selected frequency harmonic and then sweep downwards, i.e. by adding a negative voltage in the adding means.

It should be clear, of course, that the invention is not limited to the specifically illustrated embodiments, but that it can be varied in a number of ways without departing from the scope of the appended claims. If a stepwise reduction of the sweep rate is implemented, the steps may be longer at the beginning, and shorter at the end etc. Different modes may be used, a first mode with longer steps, a second mode with shorter steps when the $\Delta f_c$ value assumes a given amount, etc. Any variation is in principle possible.

What is claimed is:

1. An arrangement for phase locking of a Voltage Controlled Oscillator (VCO) to a selected frequency harmonic among a number of predetermined or available frequencies (harmonics), comprising a reference generator for generating a reference frequency, a phase lock loop for producing an output signal in response to the input reference frequency, said phase lock loop comprising a phase detector, a loop filter, said VCO, adding means and a power splitter, a sweep generator further being provided, characterized in that it further comprises or is associated with storing means for storing information about, for each selectable or available frequency harmonic, a first (coarse) control voltage providing a VCO frequency output which is lower/higher than, and differs from the selected frequency (harmonic) by a given value, that the sweep generator adds a controllable sweep voltage to/on the first control voltage at least until a varying, second difference between the output VCO frequency and the selected frequency harmonic reaches a given value, monitoring/detecting means being provided for detecting the varying, second difference between the selected frequency harmonic and the VCO output frequency, and in that sweep generator control means are provided for reducing the sweep rate until the VCO is phase locked to the selected frequency harmonic.

2. An arrangement according to claim 1,
characterized in that the monitoring/detecting means provides for a detection at discrete intervals of the varying, second difference, between the selected frequency harmonic and the VCO output frequency.

3. An arrangement according to claim 1,
characterized in that the monitoring/detecting means provides for a continuous detection of the varying, second frequency difference, between the selected frequency harmonic and the VCO output frequency.

4. An arrangement according to claim 1,
characterized in that the sweep generator control means continuously reduces the sweep rate in dependence of the detection of the varying, second frequency difference.

5. An arrangement according to claim 1, characterized in that that the sweep generator control means stepwise reduces the sweep rate.

6. An arrangement according to claim 1,
characterized in that the phase locking loop is a sampled phase-lock loop (SPLL) i.e. that the phase detector is a sampling phase detector.

7. An arrangement according to claim 1,
characterized in that the phase detector is a non-sampling phase detector.

8. An arrangement according to claim 1, characterized in that the sweep generator is disconnected, switched off, when the VCO is phase locked.

9. An arrangement according to claim 1, characterized in that it comprises an integrating loop filter for which the integrating functionality can be switched off.

10. An arrangement according to claim 1, characterized in that a DC voltage is detected as output from the phase detector when phase lock has been achieved.

11. An arrangement according to claim 1, characterized in that the control means comprising supplementary control means provide for a continuous sweep from the sweep generator also when the comparator is not able to detect a signal from the phase detector.

12. An arrangement according to claim 9, characterized in that the phase detector is narrow-banded.

13. An arrangement according to claim 9, characterized in that the supplementary control means provides control signals to the loop filter disposed between the phase detector and the adding means to control activation/deactivation of the integrating functionality of the loop filter.

14. An arrangement according to claim 9, characterized in that the signal from the phase detector detected via a comparator and a monostable gate is input to the sweep generator.

15. An arrangement according to claim 14, characterized in that a signal pulse from the monostable gate is detected via a first signal indicating that a first fixed sweep rate is to be replaced by a second sweep rate, the rate of which is continuously or stepwise reduced as the frequency difference is reduced.

16. An arrangement according to claim 14, characterized in that a D/A-converter is disposed between the storing means and the adding means providing the input signal to the VCO.

17. A method for locking the phase of a voltage controlled oscillator to a selected frequency harmonic among a number of predetermined (available) frequency harmonies, characterized in that it comprises the steps of:
finding, in storing means, a first control voltage associated with the selected frequency harmonic which has a value such that the frequency of the VCO will be lower/higher than, and differ from, the selected frequency harmonic by a given first frequency,
applying the found first control voltage,
adding a sweep voltage to the first control voltage,
detecting/monitoring a varying, second frequency difference between the VCO frequency and the selected frequency harmonic,
controlling the rate of the sweep voltage at least at detection of a predetermined frequency difference by reducing it until the VCO is phase locked to the selected frequency harmonic.

18. A method according to claim 17, characterized in that it comprises the step of:
monitoring the second, varying frequency difference continuously.

19. A method according to claim 17, characterized in that it comprises the step of:
establishing the second, varying frequency difference instantly at discrete time intervals.

20. A method according to claim 17, characterized in that it comprises the step of:
reducing the rate of the sweep continuously or stepwise.

21. A method according to claim 17, characterized in that it comprises the steps of:
providing a reference signal with the selected frequency to the phase detector,
finding the first control voltage in storing means,
converting in a D/A-converter the output from the storing means,
applying the first control voltage to the VCO,
detecting the second, varying, frequency difference from the sampling phase detector,
using said frequency difference signal to control a sweep generator,
when the output signal from the sampling phase detector comprises a DC-voltage, or when the time period, that lapses between two consecutive pulses from a comparator, detecting pulses from the phase detector, is long enough, indicating phase lock to the selected frequency harmonic, the sweep is switched off.

22. A method according to claim 21, characterized in that it comprises the step of:
providing control signal from a supplementary control means to the sweep generator, to the loop filter of the phase lock loop and to the storing means to assure that the selected frequency harmonic is found despite it not being possible to detect any output signal from the phase detector.

23. A method according to claim 21, characterized in that it comprises the step of using an integrating switch-offable loop filter, and in that the integrating functionality of the loop filter is switched off when a frequency shift is started, and switched on when phase lock is achieved, the activation/deactivation of the integrating functonality of the loop filter being controlled by a/the supplementary control means.

* * * * *